(12) United States Patent
Zhao et al.

(10) Patent No.: US 11,116,094 B2
(45) Date of Patent: Sep. 7, 2021

(54) SUPPORTING DEVICE

(71) Applicant: Yungu (Gu'an) Technology Co., Ltd., Langfang (CN)

(72) Inventors: Yongfeng Zhao, Langfang (CN); Hongqi Hou, Langfang (CN); Fu Liao, Langfang (CN); Liwei Ding, Langfang (CN); Yuhua Wu, Langfang (CN); Fan Dong, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 0 days.

(21) Appl. No.: 16/901,635

(22) Filed: Jun. 15, 2020

(65) Prior Publication Data

US 2020/0315048 A1    Oct. 1, 2020

Related U.S. Application Data

(63) Continuation of application No. PCT/CN2019/078133, filed on Mar. 14, 2019.

(30) Foreign Application Priority Data

Sep. 19, 2018 (CN) .......................... 201811093388.9

(51) Int. Cl.
*H05K 5/02* (2006.01)
*H05K 5/00* (2006.01)
*E05D 11/00* (2006.01)

(52) U.S. Cl.
CPC ....... *H05K 5/0226* (2013.01); *E05D 11/0081* (2013.01); *H05K 5/0017* (2013.01); *E05Y 2900/606* (2013.01)

(58) Field of Classification Search
CPC ................ H05K 5/0226; H05K 5/0017; E05D 11/0081; E05Y 2900/606; G06F 1/1616;
(Continued)

(56) References Cited

U.S. PATENT DOCUMENTS 9,541,962 B2 * 1/2017 Siddiqui ................... E05D 1/00
10,209,746 B2 * 2/2019 Baek ..................... G06F 1/1675
(Continued)

FOREIGN PATENT DOCUMENTS

| CN | 101971124 A | 2/2011 |
| CN | 103827771 A | 5/2014 |

(Continued)

OTHER PUBLICATIONS

PCT International Search Report of PCT/CN2019/078133 dated Jun. 25, 2019.

(Continued)

*Primary Examiner* — Abhishek M Rathod
(74) *Attorney, Agent, or Firm* — Ladas & Parry LLP

(57) ABSTRACT

Embodiments of the present application disclose a supporting device, which relates to the field of display technologies. The supporting device includes: a supporting frame configured to support a display screen, the supporting frame defining a supporting chamber therein; at least one storing chamber for storing a flowing medium, the storing chamber being communicated with the supporting chamber through a channel; and an assisting member, configured to make the flowing medium flow between the supporting chamber and the storing chamber. In the embodiments of the present application, the supporting device can facilitate the display screen to realize functions of touch and support, and realize the portability of a large-screen display device.

15 Claims, 5 Drawing Sheets

(58) Field of Classification Search
CPC .... G06F 1/1652; G06F 1/1618; G06F 1/1641; G06F 1/1656; G06F 1/1675; G09F 9/301
See application file for complete search history.

(56) References Cited

U.S. PATENT DOCUMENTS

| | | | |
|---|---|---|---|
| 10,382,600 B2* | 8/2019 | Lin | H04M 1/0216 |
| 2012/0307423 A1* | 12/2012 | Bohn | G06F 1/1652 361/679.01 |
| 2013/0037228 A1* | 2/2013 | Verschoor | G06F 1/1652 160/377 |
| 2013/0083496 A1* | 4/2013 | Franklin | G09G 3/2092 361/749 |
| 2015/0220117 A1* | 8/2015 | Lee | G06F 1/1652 361/749 |
| 2016/0364000 A1* | 12/2016 | Ciesla | G06F 3/016 |
| 2017/0092892 A1 | 3/2017 | Zhang et al. | |
| 2018/0217639 A1 | 8/2018 | Jones et al. | |
| 2018/0364764 A1* | 12/2018 | Lin | G06F 1/1656 |

FOREIGN PATENT DOCUMENTS

| | | |
|---|---|---|
| CN | 104751739 A | 7/2015 |
| CN | 105652975 A | 6/2016 |
| CN | 105679189 A | 6/2016 |
| CN | 104820511 A | 8/2016 |
| CN | 106033277 A | 10/2016 |
| CN | 106125846 A | 11/2016 |
| CN | 106205396 A | 12/2016 |
| CN | 106254589 A | 12/2016 |
| CN | 106527585 A | 3/2017 |
| CN | 206058812 U | 3/2017 |
| CN | 107863002 A | 3/2018 |
| CN | 207129067 U | 3/2018 |
| CN | 108508970 A | 9/2018 |
| CN | 109087588 A | 12/2018 |
| TW | 201128594 A | 8/2011 |

OTHER PUBLICATIONS

PCT Written Opinion of PCT/CN2019/078133 dated Jun. 25, 2019.
Chinese First Office Action dated Aug. 28, 2019 in CN Application No. 201811093388.9.
Chinese Second Office Action dated Jan. 26, 2020 in CN Application No. 201811093388.9.

* cited by examiner

SUPPORTING DEVICE

CROSS-REFERENCE TO RELATED APPLICATIONS

The present application is a continuation of International Application No. PCT/CN2019/078133 filed on Mar. 14, 2019, which claims priority to Chinese patent application No. 201811093388.9, filed on Sep. 19, 2018. Both application are incorporated herein in their entireties by reference.

TECHNICAL FIELD

The present application relates to the field of display technologies, in particular to a supporting device.

BACKGROUND

With the development of display technologies, the visual enjoyment of large-screen displays has become more and more popular. However, large-screen display devices (for example, mobile phones, tablet computers, etc.) have problems of being inconvenient to carry.

Therefore, how to make the large-screen display devices easy to be carried becomes an urgent problem to be solved.

SUMMARY

In view of this, the present application provides a supporting device to solve the problem that a large-screen display device is not easy to be carried in the prior art.

In one aspect of the present application, a supporting device is provided, including: a supporting frame for supporting a display screen, the supporting frame defining a supporting chamber therein; at least one storing chamber for storing a flowing medium, the storing chamber being communicated with the supporting chamber through a channel; and an assisting member, configured to make the flowing medium flow between the supporting chamber and the storing chamber by a movement of the assisting member.

In one embodiment of the present application, the assisting member includes a sliding baffle, and the sliding baffle moves to make the flowing medium flow into the supporting chamber or flow into the storing chamber.

In one embodiment of the present application, the sliding baffle is disposed in the storing chamber to divide the storing chamber into a carrying cavity for accommodating the flowing medium and a non-carrying cavity, when the sliding baffle moves in a direction of reducing a volume of the carrying cavity and increasing a volume of the non-carrying cavity, the flowing medium enters the supporting chamber from the carrying cavity, and when the sliding baffle moves in a direction of increasing the volume of the carrying cavity and reducing the volume of the non-carrying cavity, the flowing medium returns from the supporting chamber to the storing chamber.

In one embodiment of the present application, the assisting member further includes at least one spring provided between the sliding baffle and an inner wall of the storing chamber, and the at least one spring configured to drive the sliding baffle to move.

In one embodiment of the present application, the at least one spring is disposed in the carrying cavity or the non-carrying cavity.

In one embodiment of the present application, the at least one spring includes two springs, the two springs are symmetrically disposed on both sides of a symmetrical axis of the sliding baffle.

In one embodiment of the present application, the assisting member further includes a shift lever disposed on an outer wall of the storing chamber and connected to the sliding baffle, and the shift lever is configured to drive the sliding baffle to move in the storing chamber.

In one embodiment of the present application, the assisting member further includes a sealing ring disposed between an inner wall of the storing chamber and a side wall of the sliding baffle.

In one embodiment of the present application, the supporting device further includes a sealing film, the flowing medium is filled in the sealing film, the sliding baffle is disposed outside the sealing film, and the sealing film crosses the supporting chamber and the carrying cavity through the channel.

In one embodiment of the present application, the assisting member further includes an electromagnetic mechanism, the sliding baffle is made of iron, and the sliding baffle moves under adsorption of the electromagnetic mechanism.

In one embodiment of the present application, the channel includes an inlet channel and an outlet channel, one end of the inlet channel located in the supporting chamber is provided with a one-way valve communicated with the inlet channel for unidirectional flow of the flowing medium, and/or one end of the outlet channel located in the storing chamber is provided with a one-way valve communicated with the outlet channel for unidirectional flow of the flowing medium.

In one embodiment of the present application, the supporting chamber and the storing chamber are both vacuum chambers.

In one embodiment of the present application, the at least one storing chamber includes two storing chambers, and the two storing chambers are respectively disposed adjacent to both sides of the supporting chamber.

In one embodiment of the present application, the supporting device further includes a housing, the housing includes a first sub-housing and a second sub-housing, the first sub-housing and the second sub-housing are respectively connected to the supporting chamber, and one of the two storing chambers is disposed inside the first sub-housing, and the other one of the two storing chambers is disposed inside the second sub-housing.

In one embodiment of the present application, the one of the two storing chambers is integrally formed with the first sub-housing, and the other one of the two storing chambers is integrally formed with the second sub-housing.

In one embodiment of the present application, a side wall of the supporting chamber is made of a thin film material.

In another aspect of the present application, a display device is provided, including: a supporting device according to any one of embodiments described above; and a display screen including a bending region. The supporting frame is configured to a structure supporting the display screen, the supporting frame defines the supporting chamber therein, and the supporting chamber is opposite to the bending region of the display screen.

In the embodiments of the present application, a supporting device is arranged on one side of a display screen, so that when the display device is flattened, a supporting chamber of the supporting device may make the flowing medium enter the supporting chamber under the action of an assisting member to support the display screen, thereby facilitating the display screen to realize functions of touch and support. In addition, when the display device needs to be folded, the supporting chamber of the supporting device may discharge the flowing medium under the action of the assisting member, so that the display device can be bent, thereby realizing the portability of a large-screen display device.

DETAILED DESCRIPTION OF THE EMBODIMENTS

Figure 1:
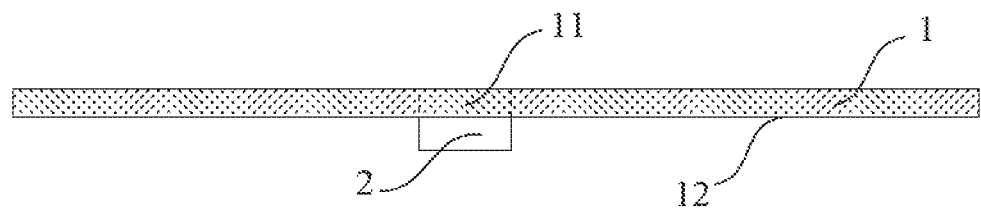
FIG. 1 is a schematic structural diagram illustrating a supporting device according to an embodiment of the present application.

The technical solutions in the embodiments of the present application are clearly and completely described in the following with reference to the accompanying drawings in the embodiments of the present application. It is obvious that the described embodiments are only a part of the embodiments of the present application, and not all of the embodiments. Based on the embodiments of the present application, all other embodiments obtained by those skilled in the art without creative efforts, shall fall within the protection scope of the present application.

Wherever possible, the same or similar parts mentioned in various parts of the accompanying drawings will be marked with the same reference numerals.

Figure 2:
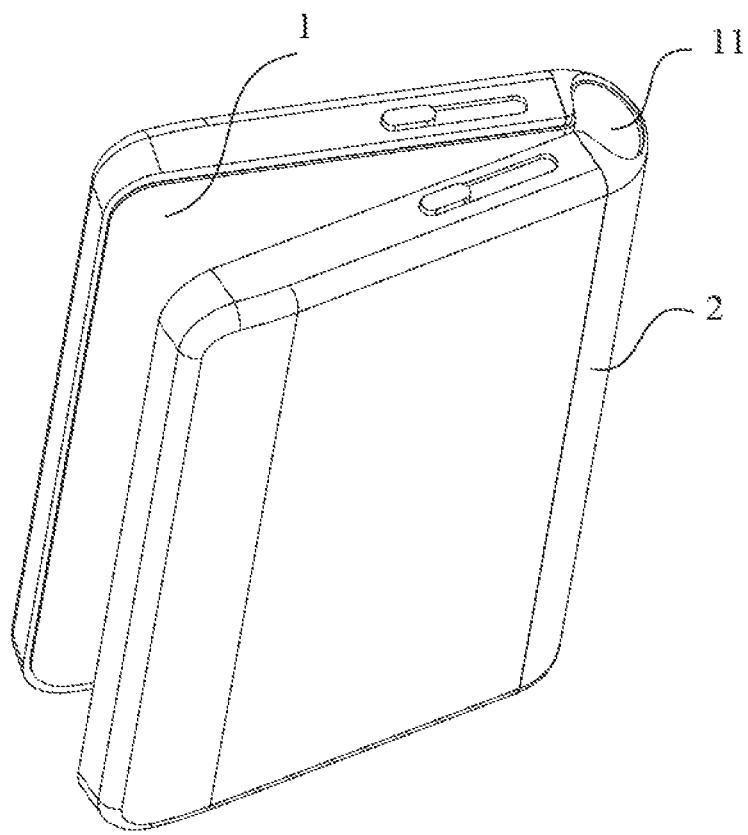
FIG. 2 is a schematic diagram illustrating a display device in a folded state according to an embodiment of the present application.
Figure 3:
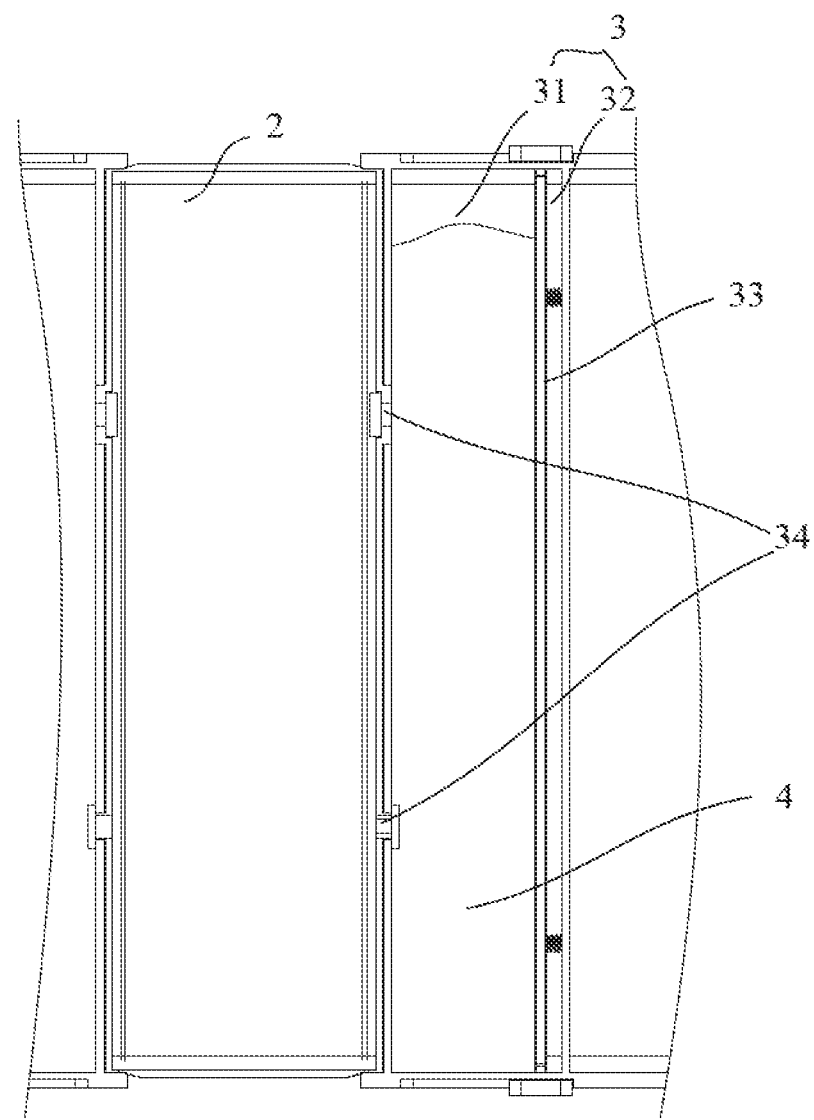
FIG. 3 is a schematic structural diagram illustrating a supporting device according to another embodiment of the present application.

FIG. 1 is a schematic structural diagram illustrating a supporting device according to an embodiment of the present application. FIG. 2 is a schematic diagram illustrating a display device in a folded state according to an embodiment of the present application. FIG. 3 is a schematic structural diagram illustrating a supporting device according to another embodiment of the present application.

As shown in FIG. 1, the supporting device includes a supporting frame configured to supporting a display screen 1, at least one storing chamber 3 for storing a flowing medium 4, and an assisting member, configured to make the flowing medium 4 flow between the supporting chamber 2 and the storing chamber 3. The supporting frame is provided with a supporting chamber 2 therein. The storing chamber 3 is communicated with the supporting chamber 2 through a channel 34.

A supported member supported by the supporting device may be the display screen 1. A bending region 11 included in the display screen 1 may refer to a region having flexibility. Correspondingly, the display screen 1 may be a flexible display screen 1, or may be a display screen 1 including a flexible region. In other words, the display screen 1 may include a flexible region and a non-flexible region, and the type of the display screen 1 is not specific limited herein. In the bending region 11, the display screen 1 may be folded as shown in FIG. 2, so as to reduce an area occupied by the display screen 1, thereby facilitating the carrying of the display device.

The supporting chamber 2 has a chamber, and the bending region 11 may be supported by filling the flowing medium 4 in the chamber. Specifically, the supporting chamber 2 may have flexibility, for example, in an embodiment of the present application, a side wall of the supporting chamber 2 may be made of a thin film material. When the supporting chamber 2 is filled with the flowing medium 4, whether the bending region 11 of the display screen 1 is in a bent state or a flat state, the supporting chamber 2 can support the bending region 11. For example, when the bending region 11 is a touch display region of the display screen 1, if the bending region 11 is in a flat state, the supporting chamber 2 supports the bending region 11 so that the bending region 11 realizes a touch function. If the bending region 11 is in a bent state, the supporting chamber 2 supports the bending region 11, so as to protect the bending region 11 and a region where the bending region 11 is located from being damaged by an external force. In addition, the bending region 11 may also be a non-touch display region of the display screen 1, and whether the bending region 11 has a display function is not limited herein.

When the bending region 11 is in a bent state, in order to avoid an excessive compression to the bending region 11 caused by the supporting chamber 2, to thereby damage the bending region 11, a volume of the flowing medium 4 filled in the supporting chamber 2 may be less than that when the bending region 11 is in a flat state. Optionally, the supporting chamber 2 may not be filled with the flowing medium 4. In addition, the supporting chamber 2 is filled with a small amount of the flowing medium 4 or not filled with any flowing medium 4, which may also facilitate folding the display screen 1 in the bending region 11.

In addition, the flowing medium 4 may be a liquid, a gas or a powdery solid. For example, the liquid may be oil having high fluidity, the gas may be air, nitrogen, or the like, and the powdery solid may be quicksand, talcum powder, etc. The specific type of the flowing medium 4 is not limited herein.

The assisting member may refer to a structural member that assists the flowing medium 4 to enter the supporting chamber 2 or to be discharged from the support chamber 2. For example, when the flowing medium 4 is a gas, the assisting member may include an airbag, and a channel communicating with the airbag and the supporting chamber 2 is a one-way channel, i.e., when the airbag is squeezed, and the gas in the airbag can only enter the supporting chamber 2. When the gas in the supporting chamber 2 needs to be discharged, the gas may be discharged through a closable exhaust port on the supporting chamber 2. When the flowing medium 4 is a liquid, a structure of the assisting member may refer to the following embodiments, and in order to avoid repetition, details are not described herein again.

Specifically, the flowing medium 4 filled in the supporting chamber 2 may be supplied by an external device or by an internal structure, and the source of the flowing medium 4 is not limited herein.

For the convenience of supply, the flowing medium 4 may be preferably supplied by an internal structure. Specifically, the supporting device may further include the storing chamber 3 for storing the flowing medium 4. The storing chamber 3 may also have a chamber used to store the flowing medium 4 when the supporting chamber 2 does not need to be filled with the flowing medium 4. When the supporting chamber 2 needs to be filled with the flowing medium 4, the flowing medium 4 may enter the supporting chamber 2 through the channel 34 between the supporting chamber 2 and the storing chamber 3; and then, when the supporting chamber 2 no longer needs the flowing medium 4, or the volume of the flowing medium 4 required by the supporting chamber 2 needs to be reduced, the flowing medium 4 may enter the storing chamber 3 through the channel 34 between the supporting chamber 2 and the storing chamber 3 again. The arrangement of the storing chamber 3 may effectively avoid the consumption of the flowing medium 4.

In the embodiments of the present application, a supporting device is arranged on one side 12 of a display screen 1, so that when the display device is flattened, a supporting chamber 2 of the supporting device may make the flowing medium 4 enter the supporting chamber 2 under the action of an assisting member to support the display screen 1, thereby facilitating the display screen 1 to realize functions of touch and support. In addition, when the display device needs to be folded, the supporting chamber 2 of the supporting device may discharge the flowing medium 4 under the action of the assisting member, so that the display device can be bent, thereby realizing the portability of a large-screen display device.

In an embodiment of the present application, as shown in FIG. 3, the assisting member includes a sliding baffle 33 disposed in the storing chamber 3 to divide the storing chamber 3 into a carrying cavity 31 for accommodating the flowing medium 4 and a non-carrying cavity 32. The flowing medium 4 enters the supporting chamber 2 or is discharged into the carrying cavity 31 via a movement of the sliding baffle 33.

Specifically, when the sliding baffle 33 moves in a direction towards a volume reduction of the carrying cavity 31 and a volume increase of the non-carrying cavity 32, the sliding baffle 33 may push the flowing medium 4 in the carrying cavity 31 into the supporting chamber 2. Conversely, the sliding baffle 33 may move in a direction towards a volume increase of the carrying cavity 31 and a volume reduction of the non-carrying cavity 32, so that the flowing medium 4 in the supporting chamber 2 may be subsequently returned to the storing chamber 3, thereby effectively controlling a space in which the flowing medium 4 is located. It will help the flowing medium 4 in the supporting chamber 2 support the bending region 11 to realize the touch function and protect the bending region 11 from being damaged.

Figure 4:
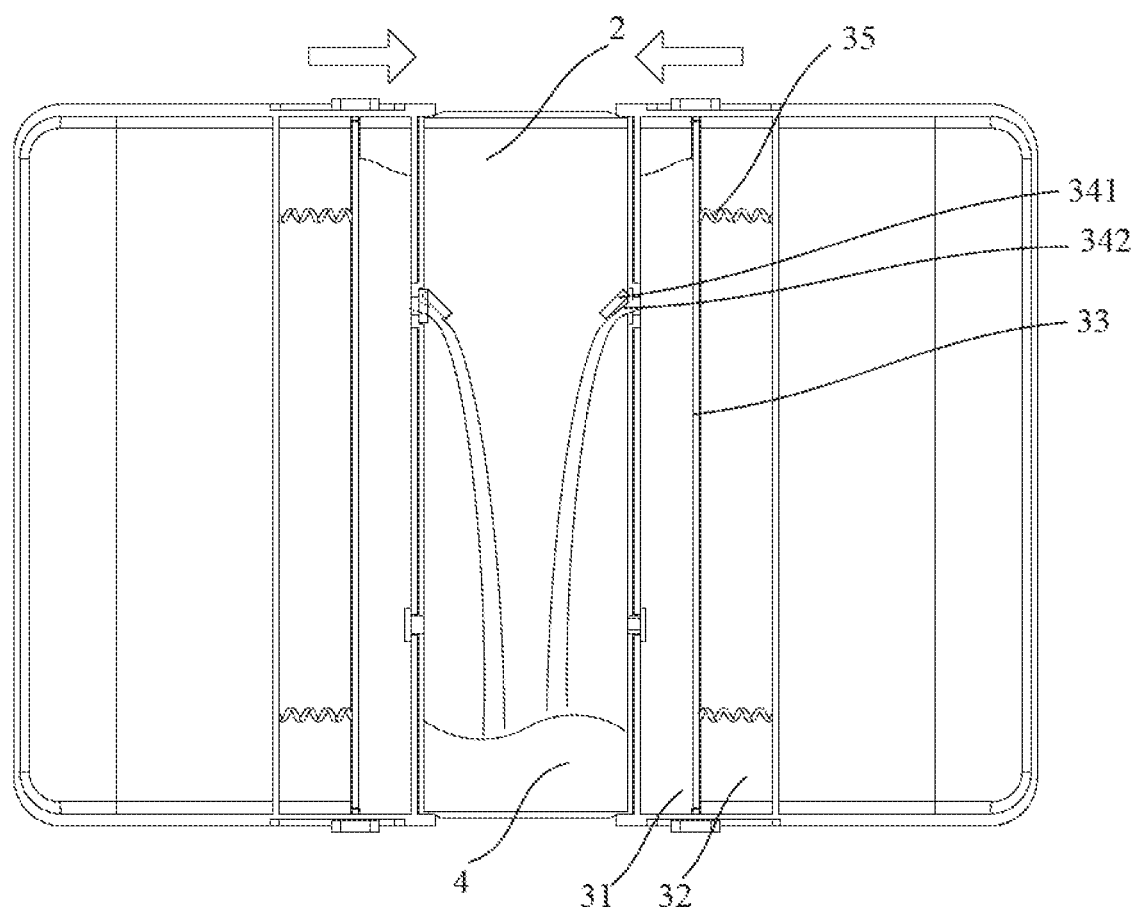
FIG. 4 is a schematic structural diagram illustrating a supporting device according to another embodiment of the present application.

FIG. 4 is a schematic structural diagram illustrating a supporting device according to another embodiment of the present application.

Furthermore, in order to speed up a rate at which the flowing medium 4 fills the support chamber 2, as shown in FIG. 4, the supporting device may include two storing chambers 3 respectively disposed at sides of the supporting chamber 2. In order to ensure the consistency of rates at which the flowing medium 4 in the two storing chambers 3 fills the supporting chamber 2, the two storing chambers 3 may be respectively arranged at opposite sides of the supporting chamber 2.

As shown in FIG. 4, the assisting member further includes at least one spring 35 arranged between the sliding baffle 33 and an inner wall of the storing chamber 3, and the at least one spring 35 drives the sliding baffle 33 to move.

Specifically, the spring 35 may be arranged in the carrying cavity 31, or in the non-carrying cavity 32, or in both the carrying cavity 31 and the non-carrying cavity 32. In order to avoid mutual influence, the spring 35 may preferably be arranged in the carrying cavity 31 or the non-carrying cavity 32. Correspondingly, when the spring 35 is located in the non-carrying cavity 32, the spring 35 may be performed to push the sliding baffle 33, in a process of pushing the flowing medium 4 in the carrying cavity 31 to fill the supporting chamber 2 by the sliding baffle 33. A direction in which the spring 35 pushes the sliding baffle 33 is shown by the arrow in FIG. 4. When the spring 35 is located in the carrying cavity 31, the spring 35 may play a pulling role on the sliding baffle 33 in a process of pushing the flowing medium 4 in the carrying cavity 31 to fill the supporting chamber 2 by the sliding baffle 33.

Furthermore, under the action of the at least one spring 35, in order to ensure the uniformity of force on the sliding baffle 33, the number of springs 35 between the sliding baffle 33 and an inner wall of the storing chamber 3 may be two. As shown in FIG. 4, the two springs 35 may be symmetrically disposed on both sides of a symmetrical axis of the sliding baffle 33.

Figure 5:
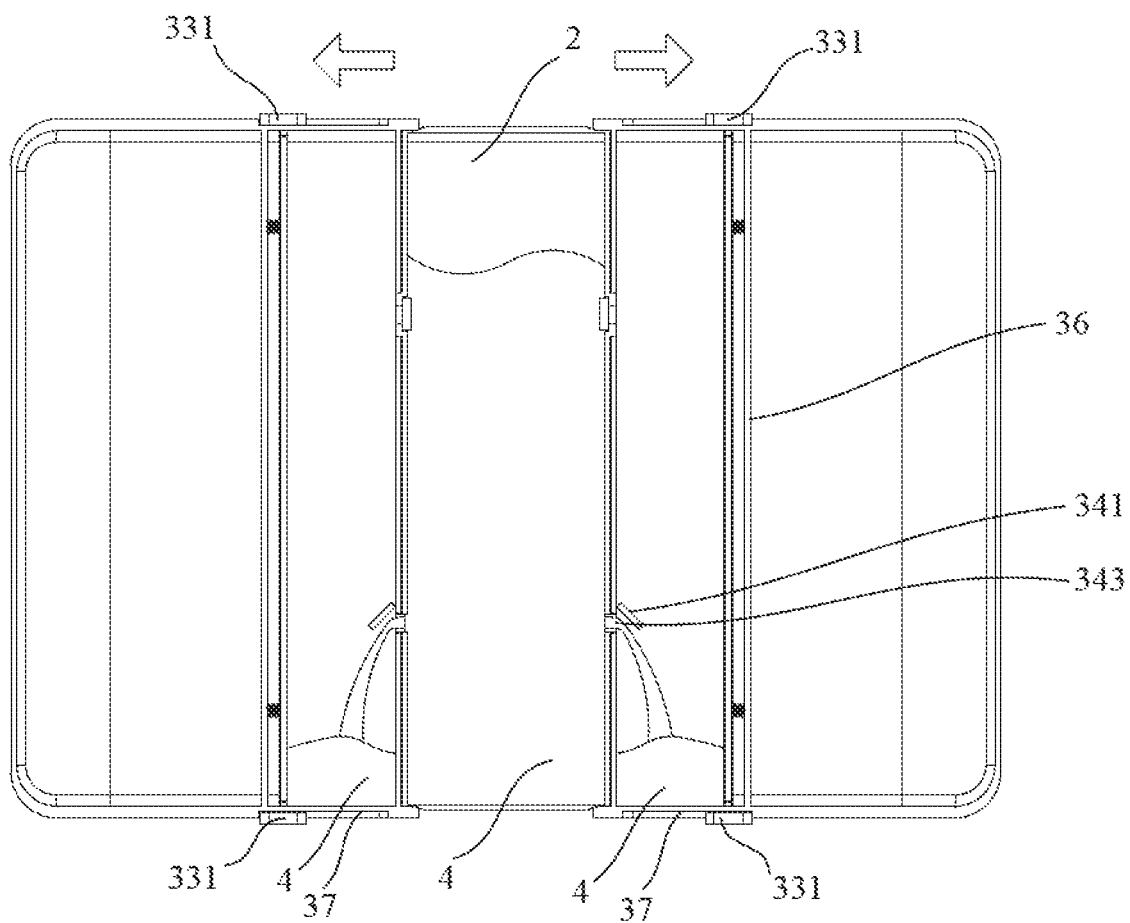
FIG. 5 is a schematic diagram illustrating the return of the flowing medium in FIG. 4 to the storing chamber.

FIG. 5 is a schematic diagram illustrating the return of the flowing medium 4 in FIG. 4 to the storing chamber 3.

In an embodiment of the present application, the assisting member may further include a shift lever 331 disposed on an outer wall of the storing chamber 3 and connected to the sliding baffle 33. The sliding baffle 33 is detachably fixed at an end portion 36 of the storing chamber 3 away from the supporting chamber 2, due to the shift lever 331.

Specifically, as shown in FIG. 4 and FIG. 5, in order to ensure the sealing of the carrying cavity 31 of the storing chamber 3 during a shifting process of the shift lever 331, i.e., in order to prevent the flowing medium 4 from flowing out of the carrying cavity 31, a thin film of the supporting chamber 2 may traverse the channel 34 between the supporting chamber 2 and the storing chamber 3, to enter into the carrying cavity 31. The flowing medium 4 in the thin film located in the carrying cavity 31 may enter into the supporting chamber 2 under the push of the sliding baffle 33. Since the sliding baffle 33 is disposed outside the thin film located in the carrying cavity 31, the sliding baffle 33 cannot be in contact with the flowing medium 4. The movement of the sliding baffle 33 will not cause the flowing medium 4 to flow out of the carrying cavity 31.

In addition, when the thin film of the supporting chamber 2 does not traverse the channel 34 between the supporting chamber 2 and the storing chamber 3 to enter into the carrying cavity 31, i.e., the sliding baffle 33 may be in contact with the flowing medium 4. A slide way 37 of the sliding baffle 33 on the outer wall of the storing chamber 3 may be closed as the sliding baffle 33 moves. When the sliding baffle 33 slides toward the supporting chamber 2, the slide way 37 of the sliding baffle 33 on the outer wall of the storing chamber 3 may be opened after the sliding baffle 33 passes; and when the sliding baffle 33 slides away from the supporting chamber 2, the slide way 37 of the sliding baffle 33 on the outer wall of the storing chamber 3 may be closed after the sliding baffle 33 passes. It is also possible that the slide way 37 of the sliding baffle 33 on the outer wall of the storing chamber 3 may be closed after the sliding baffle 33 passes, regardless of whether the sliding baffle 33 slides away from the supporting chamber 2 or slides toward the supporting chamber 2. The opening and closing of the slide way 37 of the sliding baffle 33 on the outer wall of the storing chamber 3 after the sliding baffle 33 passes are not limited herein.

It should be understood that the mechanism for fixing the sliding baffle 33 may be an electromagnetic mechanism, not limited to the above-mentioned shift lever 331. For example, the sliding baffle 33 may be made of iron. On the outside of the storing chamber 3, the electromagnetic mechanism is disposed adjacently to the end portion 36 of the storing chamber 3 away from the supporting chamber 2. The electromagnetic mechanism is connected to a battery of the supporting device. When the battery is powered, the electromagnetic mechanism may adsorb the sliding baffle 33. When the battery is not powered, the electromagnetic mechanism loses the adsorption effect on the sliding baffle 33. Therefore, the sliding baffle 33 is detachably fixed. In addition, the electromagnetic mechanism may also be disposed in the non-carrying cavity 32, and the position of the electromagnetic mechanism is not limited herein.

When the sliding baffle 33 is fixed at the end portion 36 of the storing chamber 3 away from the supporting chamber 2, the volume of the carrying cavity 31 is maximized, so that the flowing medium 4 flows from the supporting chamber 2 into the carrying cavity 31. When the sliding baffle 33 is not fixed at the end portion 36 of the storing chamber 3 away from the supporting chamber 2, the sliding baffle 33 may push the flowing medium 4 into the supporting chamber 2, so as to support the bending region 11.

The sliding baffle 33 is detachably fixed means the sliding baffle 33 is fixed or unfixed.

The assisting member may further include a sealing ring disposed between an inner wall of the storing chamber 3 and a side wall of the sliding baffle 33.

Specifically, in order to prevent the flowing medium 4 in the carrying cavity 31 from entering into the non-carrying cavity 32, the sealing ring may be disposed on the periphery of the sliding baffle 33. The sealing ring may be disposed on the sliding baffle 33 and moves along with a movement of the sliding baffle 33.

In addition, in the above embodiments, as for the case that the slide way 37 of the sliding baffle 33 on the outer wall of the storing chamber 3 is opened or closed, the sealing ring may also be disposed between the inner wall of the storing chamber 3 and the side wall of the sliding baffle 33, so as to prevent the flowing medium 4 from flowing out of the carrying cavity 31.

In an embodiment of the present application, as shown in FIG. 4 and FIG. 5, the channel 34 may include an inlet channel 342 and an outlet channel 343. One end of the inlet channel 342 located in the supporting chamber 2 is provided with a one-way valve 341 communicated with the inlet channel 342, and one end of the outlet channel 343 located in the storing chamber 3 is provided with a one-way valve 341 communicated with the outlet channel 343.

Specifically, the inlet channel 342 may be used to make the flowing medium 4 enter into the supporting chamber 2 from the storing chamber 3, and the outlet channel 343 may be used to make the flowing medium 4 enter into the storing chamber 3 from the supporting chamber 2. Moreover, the arrangement of the one-way valve 341 enables the flowing medium 4 to flow only in a single direction in the inlet channel 342 or the outlet channel 343, i.e., the inlet channel 342 or the outlet channel 343 cannot be used both to make the flowing medium 4 enter into the storing chamber 3 from the supporting chamber 2, and make the flowing medium 4 enter into the supporting chamber 2 from the storing chamber 3. In addition, the arrangement of the one-way valve 341 makes the flowing medium 4 flow only in a direction toward the one-way valve 341 in the inlet channel 342, and the flowing medium 4 outside the inlet channel 342 cannot enter into an interior of the inlet channel 342 through the one-way valve 341, so as to control a flow direction of the flowing medium 4. A process happened in the outlet channel 343 is similar to that happened in the inlet channel 342 as described above. It should be understood that, in order to speed up the flow efficiency of the flowing medium 4, a plurality of the above-mentioned inlet channel 342 and outlet channel 343 may be provided, and the number of the inlet channels 342 and the number of the outlet channels 343 are not limited herein.

In an embodiment of the present application, both the supporting chamber 2 and the storing chamber 3 may be vacuum chambers.

Specifically, when the flowing medium 4 is a liquid, both the supporting chamber 2 and the storing chamber 3 may be the vacuum chambers. At this time, an external atmospheric pressure may be greater than that in the supporting chamber 2 and the storing chamber 3. When the sliding baffle 33 is changed from a non-fixed state to a fixed state, for example, when the shift lever 331 is driven to move the sliding baffle 33 from one end close to the supporting chamber 2 to another end away from the supporting chamber 2, since the supporting chamber 2 includes a flexible region, under the action of the atmospheric pressure, the flowing medium 4 in the supporting chamber 2 may automatically enter into the storing chamber 3. The operation is easy and convenient. And then, the effect of the supporting chamber 2 supporting the bending region 11 will be weakened, so that the display screen 1 can be bent to fold the display screen 1.

Figure 6:
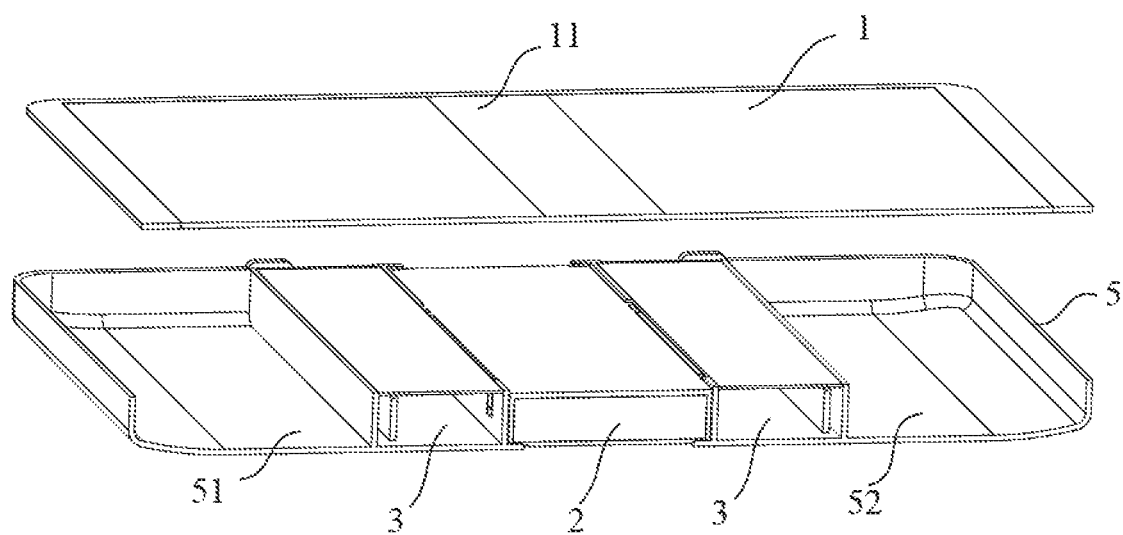
FIG. 6 is a schematic cross-sectional diagram illustrating a display device according to an embodiment of the present application.

FIG. 6 is a schematic cross-sectional diagram illustrating a display device according to an embodiment of the present application.

In an embodiment of the present application, the supporting device may further include a housing 5. The housing 5 includes a first sub-housing 51 and a second sub-housing 52 respectively connected to the supporting chamber 2. One storing chamber 3 is disposed inside the first sub-housing 51, and the other storing chamber 3 is disposed inside the second sub-housing 52.

Specifically, as shown in FIG. 6, a material of the housing 5 may have a certain hardness compared to a material of the supporting chamber 2, so that the housing 5 may support and protect regions of the display screen 1 except the bending region 11. In addition, the materials of the side walls of the two storing chambers 3 may be the same as that of the first sub-housing 51 and the second sub-housing 52. In other words, the two storing chambers 3 may be internal structures of the first sub-housing 51 and the second sub-housing 52. In the process of preparation, the two storing chambers 3 may be prepared together with the first sub-housing 51 and the second sub-housing 52 to achieve integral molding.

In addition, for the supporting device, the supporting chamber 2 may be located at a central position of the supporting device or at a non-central position, and the position of the supporting chamber 2 is not limited herein. When a size of the display screen 1 is relatively large, the number of supporting chambers 2 in the supporting device may not be only one, but may be multiple. The number of the supporting chambers 2 is not limited herein. Accordingly, the number of the supporting chambers 2 is more than one, and the number of the storing chambers 3 matched with the supporting chambers 2 may also be more than two. The number of the storing chambers 3 is not limited herein.

The supporting device according to the embodiments of the present application has been described above, and a display device according to the embodiments of the present application will be described below with reference to FIG. 1 to FIG. 3.

Specifically, as shown in FIG. 1 to FIG. 3, the display device may include: a supporting device as described in any one of the above embodiments; and a display screen 1 including a bending region 11. The supporting frame is configured to support the display screen 1. The supporting frame defines the supporting chamber 2 therein, and the supporting chamber 2 is opposite to the bending region 11 of the flexible display screen.

The specific details of the display device may be referred to the above embodiments, and in order to avoid repetition, details are not described herein again.

The above are only the preferred embodiment of the present application, and are not used to limit the protection scope of the present application. Any modification, equivalent replacement, improvement, etc. made within the spirit and principles of the present application shall be included in the protection scope of the present application.

What is claimed is:

1. A supporting device, comprising:
a supporting frame for supporting a display screen, the supporting frame defining a supporting chamber therein;
at least one storing chamber for storing a flowing medium, the storing chamber being communicated with the supporting chamber through a channel;
an assisting member, configured to make the flowing medium flow between the supporting chamber and the storing chamber by a movement of the assisting member;
wherein the assisting member comprises a sliding baffle, and the sliding baffle moves to make the flowing medium flow into the supporting chamber or flow into the storing chamber;
wherein the sliding baffle is disposed in the storing chamber to divide the storing chamber into a carrying cavity for accommodating the flowing medium and a non-carrying cavity,
when the sliding baffle moves in a direction of reducing a volume of the carrying cavity and increasing a volume of the non-carrying cavity, the flowing medium enters the supporting chamber from the carrying cavity, and
when the sliding baffle moves in a direction of increasing the volume of the carrying cavity and reducing the volume of the non-carrying cavity, the flowing medium returns from the supporting chamber to the storing chamber.

2. The supporting device according to claim 1, wherein the assisting member further comprises at least one spring provided between the sliding baffle and an inner wall of the storing chamber, and the at least one spring configured to drive the sliding baffle to move.

3. The supporting device according to claim 2, wherein the at least one spring is disposed in the carrying cavity or the non-carrying cavity.

4. The supporting device according to claim 2, wherein the at least one spring comprises two springs, the two springs are symmetrically disposed on both sides of a symmetrical axis of the sliding baffle.

5. The supporting device according to claim 1, wherein the assisting member further comprises a shift lever disposed on an outer wall of the storing chamber and connected to the sliding baffle, and the shift lever is configured to drive the sliding baffle to move in the storing chamber.

6. The supporting device according to claim 1, wherein the assisting member further comprises a sealing ring disposed between an inner wall of the storing chamber and a side wall of the sliding baffle.

7. The supporting device according to claim 1, further comprising a sealing film, wherein the flowing medium is filled in the sealing film, the sliding baffle is disposed outside the sealing film, and the sealing film crosses the supporting chamber and the carrying cavity through the channel.

8. The supporting device according to claim 1, wherein the assisting member further comprises an electromagnetic mechanism, the sliding baffle is made of iron, and the sliding baffle moves under adsorption of the electromagnetic mechanism.

9. The supporting device according to claim 1, wherein the channel comprises an inlet channel and an outlet channel,
one end of the inlet channel located in the supporting chamber is provided with a one-way valve communicated with the inlet channel for unidirectional flow of the flowing medium, and/or one end of the outlet channel located in the storing chamber is provided with a one-way valve communicated with the outlet channel for unidirectional flow of the flowing medium.

10. The supporting device according to claim 1, wherein the supporting chamber and the storing chamber are both vacuum chambers.

11. The supporting device according to claim 1, wherein the at least one storing chamber comprises two storing chambers, and the two storing chambers are respectively disposed adjacent to both sides of the supporting chamber.

12. The supporting device according to claim 11, further comprising a housing,
wherein the housing comprises a first sub-housing and a second sub-housing, the first sub-housing and the second sub-housing are respectively connected to the supporting chamber, and one of the two storing chambers is disposed inside the first sub-housing, and the other one of the two storing chambers is disposed inside the second sub-housing.

13. The supporting device according to claim 12, wherein the one of the two storing chambers is integrally formed with the first sub-housing, and the other one of the two storing chambers is integrally formed with the second sub-housing.

14. The supporting device according to claim 1, wherein a side wall of the supporting chamber is made of a thin film material.

15. A display device, comprising:
a display screen comprising a bending region; and
a supporting device comprising a supporting frame for supporting the display screen, the supporting frame defining a supporting chamber therein,
at least one storing chamber for storing a flowing medium, the storing chamber being communicated with the supporting chamber through a channel,
an assisting member, configured to make the flowing medium flow between the supporting chamber and the storing chamber by a movement of the assisting member;
wherein the supporting chamber is opposite to the bending region of the display screen;
wherein the assisting member comprises a sliding baffle, and the sliding baffle moves to make the flowing medium flow into the supporting chamber or flow into the storing chamber;
wherein the sliding baffle is disposed in the storing chamber to divide the storing chamber into a carrying cavity for accommodating the flowing medium and a non-carrying cavity,
when the sliding baffle moves in a direction of reducing a volume of the carrying cavity and increasing a volume of the non-carrying cavity, the flowing medium enters the supporting chamber from the carrying cavity, and when the sliding baffle moves in a direction of increasing the volume of the carrying cavity and reducing the volume of the non-carrying cavity, the flowing medium returns from the supporting chamber to the storing chamber.

* * * * *